United States Patent [19]

Herberle

[11] Patent Number: 5,412,644
[45] Date of Patent: May 2, 1995

[54] SERIAL BUS SYSTEM WITH A SINGLE-WIRE LINE

[75] Inventor: Klaus Herberle, Reute, Germany

[73] Assignee: Deutsche ITT Industries GmbH, Freiburg, Germany

[21] Appl. No.: 120,893

[22] Filed: Sep. 13, 1993

[30] Foreign Application Priority Data

Sep. 16, 1992 [DE] Germany ............... 42 309 13.1

[51] Int. Cl.⁶ ........................................ H04L 29/06
[52] U.S. Cl. ...................... 370/85.3; 340/825.64; 340/825.67; 375/237; 370/44
[58] Field of Search ............ 370/8, 9, 18, 31, 32, 370/41, 44, 85.1, 85.3, 101; 375/21, 36, 7; 340/825.57, 825.62, 825.65, 825.67; 341/63, 64

[56] References Cited

U.S. PATENT DOCUMENTS

| | | | |
|---|---|---|---|
| 2,430,139 | 1/1944 | Peterson | 375/21 |
| 3,723,657 | 3/1973 | Muller | 370/44 |
| 3,845,473 | 10/1974 | Kawashima | 340/825.65 |
| 4,677,308 | 6/1987 | Wroblewski et al. | 370/85.1 |
| 5,237,322 | 8/1993 | Heberle | 370/101 |

FOREIGN PATENT DOCUMENTS 62-95654  5/1987  Japan .

OTHER PUBLICATIONS

Patent Abstracts of Japan, P-622, vol. 11, No. 303, Oct. 3, 1987.
Data Communications, vol. 15, No. 1, Jan. 1986, New York, U.S., pp. 171-175.
"Elektronik", vol. 39, No. 10, May 11, 1990, pp. 140-143.

Primary Examiner—Benedict V. Safourek
Assistant Examiner—Huy D. Vu
Attorney, Agent, or Firm—Thomas L. Peterson

[57] ABSTRACT

A method and circuit arrangement for a single-wire bus system wherein a commercially available processor reads data from a transmitter. The transfer of the data over a single-wire line is controlled exclusively by the processor. The processor generates a pulse sequence on the single-wire line that is stopped by the transmitter after attainment of a predetermined number (N) of pulses by locking the single-wire line at a predetermined voltage level.

25 Claims, 3 Drawing Sheets

SERIAL BUS SYSTEM WITH A SINGLE-WIRE LINE

FIELD OF THE INVENTION

The present invention relates to an apparatus and method for connecting an input circuit transmitting means to a processor or receiving means by a single-wire line.

BACKGROUND OF INVENTION

Methods and circuit arrangements for connecting an input circuit to a processor by means of a single-wire line are known, for example, in telecontrol systems. In these systems data is read from a remote transmitter via a single-wire line, which may be a telephone line, and a processor is fed with the signals obtained. The data of the transmitter is advantageously transmitted in digital form, which makes the transmission more reliable. If the transmitter includes a multiple-signal source, these signals can be transmitted in a serial multiplex mode or in coded form and are separated in the processor into the individual components.

Japanese patent application No. 62-95654 (A) entitled TRANSMISSION SYSTEM FOR ASYNCHRONOUS DATA to Jun Sato discloses an apparatus for reducing the number of control lines contained in a data transmission system. In the device data can be transferred with the handshake of rise and fall state changes caused by a single control line. This circuit arrangement, however, does not place the transmission and time sequencing in exclusive control of the processing means.

It is an object of the invention to provide a method and a circuit arrangement which make it possible to transmit the signals of a transmitter to a commercially available processor, particularly a microprocessor, the transmission and time sequence being controlled only by the processor.

It is another object of the invention to design the transmitter in such a way that the signal of the single-signal source or the signals of the multiple-signal source, which may be present in analog or digital form, are brought to a suitable digital form, so that a conventional single-pin input/output processor port (I/O port) can accept the signals, regardless of whether the input/output processor port has a push-pull output or an open output stage.

It is a further object of the invention to adapt the operation of the transmitter so that, as far as possible, any commercially available processor is capable of controlling the time sequence of the transmission by means of a suitable program statement as in a software program.

SUMMARY OF THE INVENTION

The fundamental idea of the invention is to encode the signals to be transmitted by the transmitter as a number (=N) which is transmitted as a pulse sequence, e.g., by a number of ones, within the data message. The transmitter indicates its intention to transmit a message to the processor by unblocking the single-wire line, which was locked by the transmitter in the zero state, and causing external or internal circuit means to pull the line to the one state. The processor detects this and forces the single-wire line back to the zero state. Thus, the pulse sequence of ones is successively formed on the single-wire line. In the transmitter, these ones are counted. If the number of ones counted is equal to the internally coded number N, further ones on the single-wire line are suppressed.

The processor, in turn, must check after every one whether the locked zero state is already present. To this end, the processor port is switched as an input to a high-impedance state, and after a short settling interval, the voltage level on the single-wire line is checked. If the transmitter has not locked the single-wire line in the zero state, the circuit means, e.g., an external pull-up resistor, will pull the-single-wire line to the one level.

Between the end of a message and the beginning of a new message, the transmitter forms a lock interval in which the single-wire line is held at zero potential. The processor can thus detect the end of the message, too, and adopts the number of ones also counted in it as the coded number N.

A significant advantage of the invention is that commercially available processors can be used, and that only a single I/O processor port is required to connect a transmitter to the processor. Another advantage is that the transmitter requires only three leads and can thus be manufactured at low cost. A further advantage of the invention is its wide range of applications, which include a great number of peripheral circuits, such as sensors, transducers, pushbutton elements, and even simple memory devices, such as ROMs for data which are seldom needed.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Figure 1:
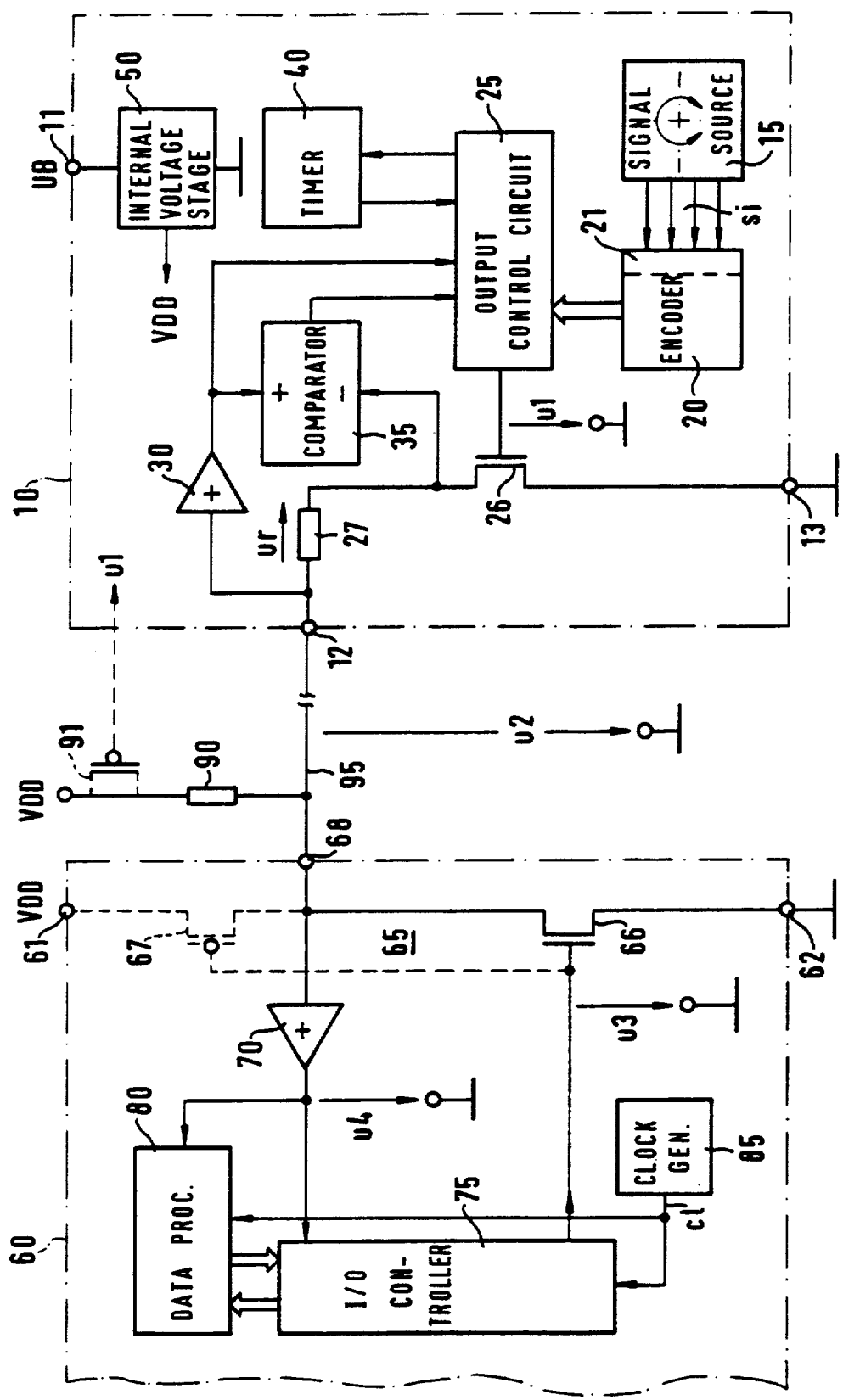
FIG. 1 is a block diagram of one preferred embodiment of the transmitter and those essential subcircuits of a processor which are coupled via the input/output port and this single-wire line to the transmitter.

Referring to FIG. 1, there is shown one preferred embodiment of a portion of a processor 60 in the area of its input/output port 68, hereinafter called the "processor port". In the output mode, the processor port 68 is in a low-impedance state, and its voltage level is controlled by an output stage 65, which is designed either as a push-pull stage with the transistors 66 and 67 or as an open-collector stage or as an open-drain stage with the transistor 66. In the output mode, the output stage 65 is in a high-impedance state, so that the processor port 68 can float. In this state, the potential at the processor port 68 is sensed by means of a sensor circuit 70 and identified as a zero or one signal by means of a threshold circuit, which may form part of the sensor circuit 70. This signal is supplied to an input/output controller 75 and to the data-processing stages connected thereto in the processor 60, which are shown in the form of a block as a data-processing device 80 to simplify the illustration. The data-processing device 80 also contains the fixed and programmable program runs and is connected by data and control lines to the input/output controller 75. The necessary system clock cl is applied from outside or generated by means of a clock generator 85 in the processor 60.

If the processor port 68 is switched by the input/output controller 75 as an output, it must be ensured in accordance with the invention that the processor port 68 is pulled via a low impedance to a fixed voltage level which, as a rule, is formed by the ground terminal 62 of the processor 60. The potential of the ground terminal 62 should be approximately equal to the potential of the ground terminal 13 of the transmitter 10. In the basic embodiment of the invention, it is not necessary for the processor terminal 68 to be pulled via a low impedance to the potential of the other supply terminal 61, which is approximately the positive supply voltage VDD; therefore, the associated pull-up transistor 67 is indicated in FIG. 1 by broken lines.

The description and the embodiment of FIG. 1 assumes that the open drain terminals can pull the associated processor port 68 active only in the direction of a lower potential. In the following, a first voltage level, 1, represents a more positive voltage level, and a second voltage level, 0, a more negative voltage level, which are also referred to as one and zero level or as one signal and zero signal, respectively. For the actual voltages, the usual threshold values are the limiting levels. In another circuit technology, the potential specifications may have to be interchanged.

The transmitter 10 has only three leads, namely one for an arbitrary positive supply voltage UB at the terminal 11, one for ground at the terminal 13, and one for the data at the output terminal 12. The positive supply voltage UB is reduced by means of an internal voltage stage 50 to an internal 5-V supply, to which the conventional semiconductor manufacturing processes, particularly the CMOS process, are adapted.

Figure 2:
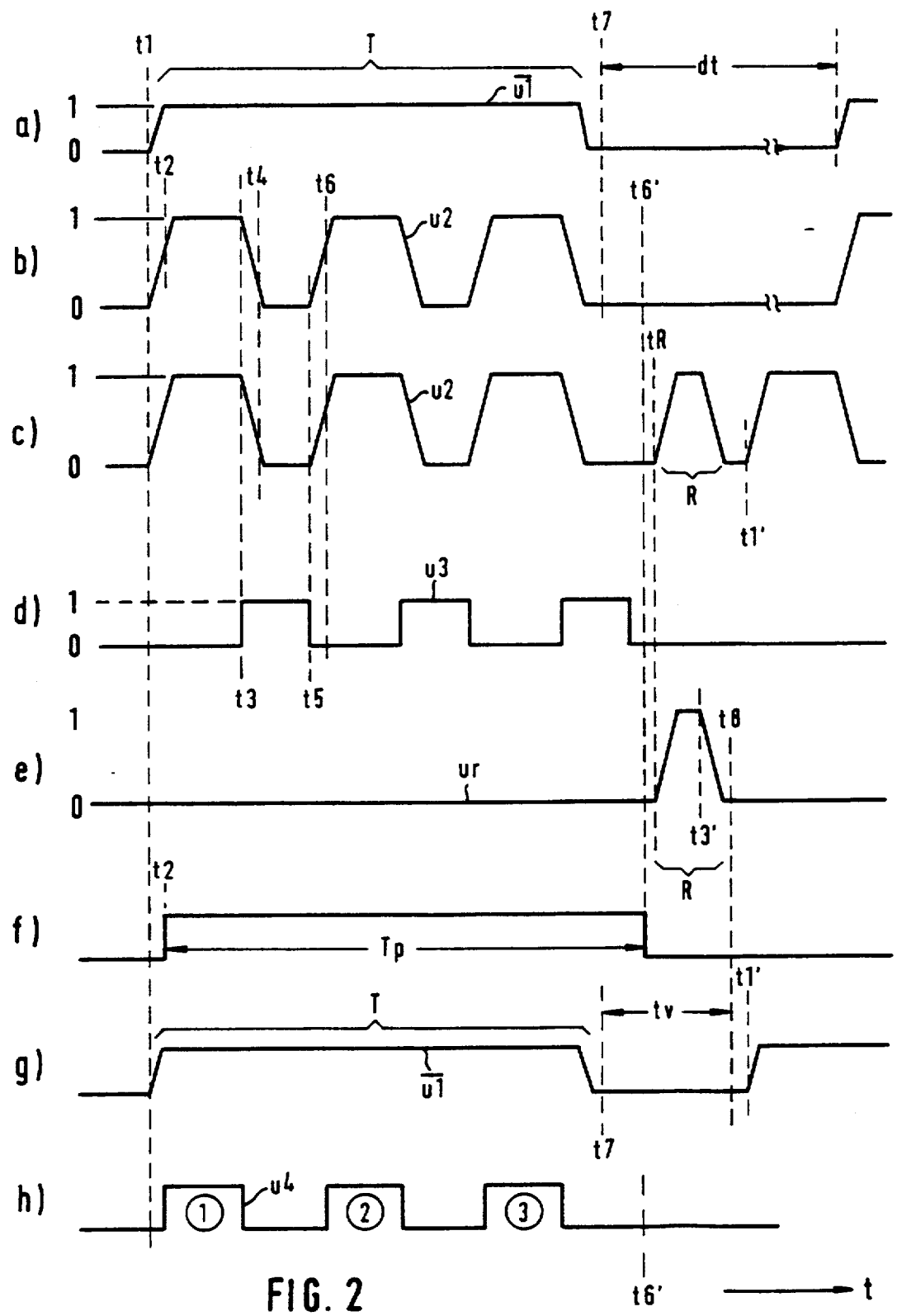
FIG. 2 is a timing diagram showing various signals of the circuit arrangement of FIG. 1.

Located at the output terminal 12 is a switch stage 26, 27 consisting of a decoupling resistor 27 in a series with a transistor 26, whose low end is connected to the ground terminal 13. The control electrode of the switching transistor 26 is connected to an output control circuit 25 which is supplied with data from an encoder 20, a timing signal from a timer 40, and the output signals from a sensor 30 and a comparator 35, the sensor being coupled to the output terminal 12. In the simplest case, the timer 40 is an RC delay stage which delays the output of the output control circuit 25 to determine the duration of the locked interval dr, as shown in FIG. 2.

The encoder 20 receives input signals si from a signal source 15 and converts them into a number N. This number is fed to the output control circuit 25. If the signal source 15 provides analog signals whose respective levels represent particular information, these signals have to be converted to digital form by means of an analog-to-digital converter 21 in the encoder 20. The digital signals are then processed in the encoder to form the number N as the output number of the encoder 20.

The coding will be explained in more detail by the following example, in which the signal source 15 consists of a synchro with an additional axial switch. The input signals si provided by the synchro are a clockwise signal and a counterclockwise signal as well as an independent axial signal if the axial switch was actuated. For the output of the encoder 20 it is irrelevant whether the input signals si are static or are present as pulses or pulse sequences. The encoder must only be able to distinguish them. In this simple example, the following combinations are conceivable, and to which the following numbers can be assigned in the encoder 20:

No function: N=0; clockwise rotation: N=1; counterclockwise rotation: N=2; axial switch actuated: N=3; clockwise rotation combined with actuated axial switch: N=4; and finally counterclockwise rotation combined with actuated axial switch: N=5.

Figure 3:
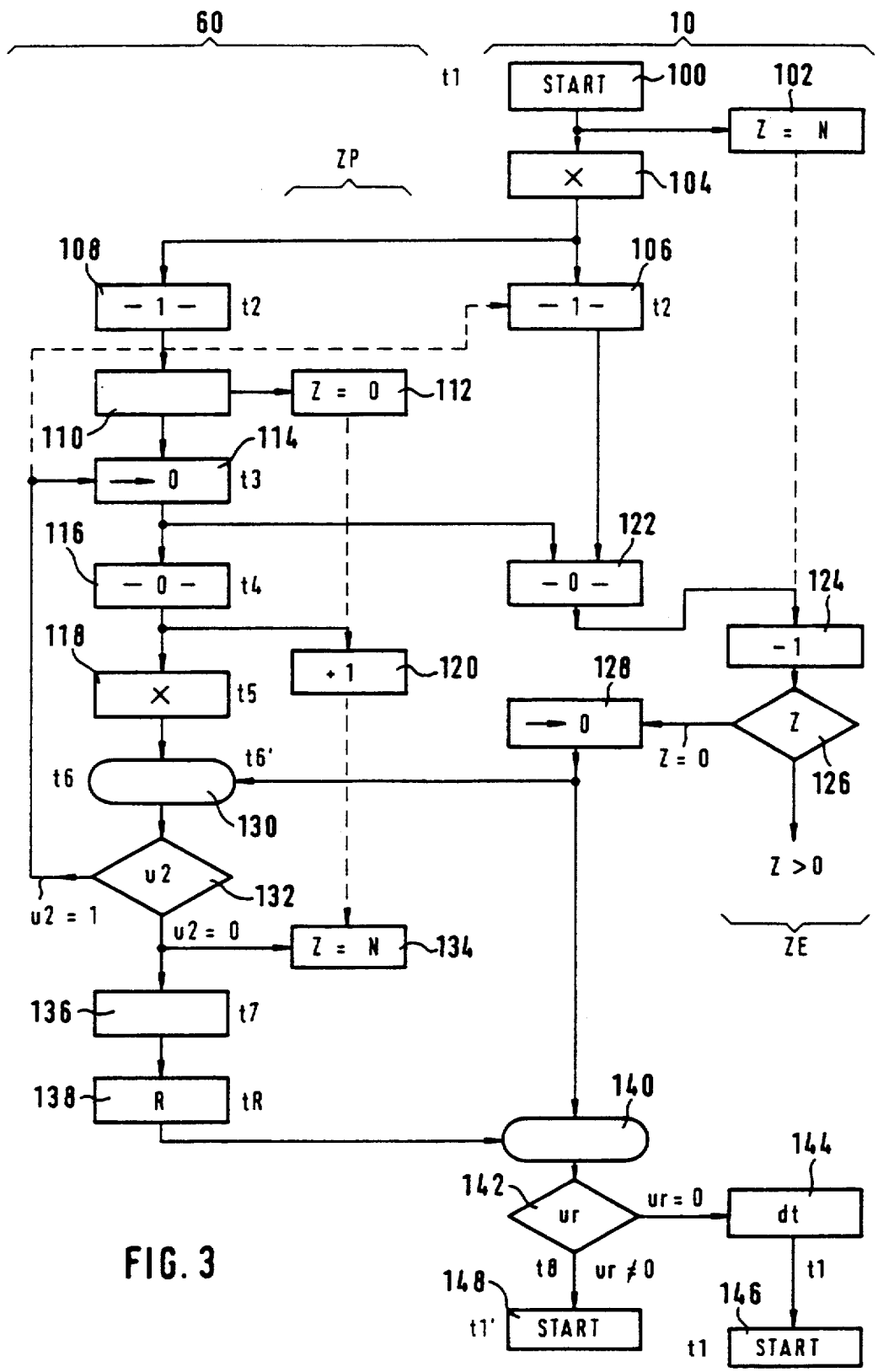
FIG. 3 is a flowchart showing the transmission of a data message.

With the number N delivered by the encoder 20, a down counter ZE in the output control circuit 25 as shown in FIG. 3 is preset to this number. In the course of a message transfer, the contents of this counter are decremented until the count (Z) is zero. The decrementing takes place each time a one-to-zero-level transition of the output terminal 12 is detected in the output control circuit 25. To this end, the respective potential of the output terminal 12 is applied as a signal through the sensor 30, which may also include a threshold stage, to the output control circuit 25. If the count is zero, the switching transistor 26 will be turned on, so that the output terminal 12 will be pulled via a low impedance to ground potential, The beginning of a new message, which is indicated by the encoder 20 to the output control circuit 25 by a number N greater than or equal to one, initiates in the output control circuit 25 the unblocking of the switching transistor 26, but not before the lock interval dt has expired.

It should be pointed out that the signal source 15 may be an electromechanical element and/or an all-electronic circuit which also realizes signal processing functions. Such a transducer or sensor may be fitted, for example, with electronic proximity switches, Hall-effect devices, temperature sensors, and the like, where the signal source requires no electromechanical switches and whose life and reliability are usually limited. In the case of the all-electronic signal sources, the associated electronics can then also be fed via the internal voltage stage 50. A particularly advantageous application of the present invention transmitter is, for example, the replacement of electromechanical rotary or sliding potentiometers used for volume control. Advantageous applications are also in automobiles, for example, if adjusting elements at the dashboard have to be connected with a central control processor.

It will also be understood that the present invention data transmission system may be used to transmit more complicated message formats. The message can be divided into standardized blocks of information such as a byte, wherein a message is comprised of a predetermined number of bytes known to the processor. Each pulse sequence from the transmitter will, for example, represent one byte of information. The processor will then decipher the sequence of pulses by means of a translation table included in the processor.

In FIG. 1, the circuit means for pull-up to the one level is an external pull-up resistor 90 which is connected at one end to the single-wire line 95 and at the other to the positive supply voltage VDD. This resistor 90 may also be part of the transmitter 10 or the processor 60, of course. In any case, it must be ensured that the pull-down to the zero level is effected via a substantially lower resistance than the value of the respective pull-up resistor.

Active control of the pull-up resistor by means of a transistor 91, which is preferably controlled by the output control circuit 25, is also possible. This has an added advantage in that in the usual quiescent state, i.e, when the single-wire line is at zero level, no shunt current can flow through the pull-up resistor.

Referring to FIG. 2 there is shown a timing diagram which illustrates various timing signals of the circuit arrangement of FIG. 1. The individual waveforms "a" through "h" are arranged one below the other in the same time scale, so that the time sequence becomes apparent.

Line a shows the inverted drive signal $\overline{u1}$ for the switching transistor 26. If the waveform shown in line a is referred to the output terminal 12, the first voltage level 1 must be regarded as a floating condition of the output terminal 12. The message T begins at the instant t1 when the output terminal 12 is enabled, and ends approximately at the instant t7 as the output terminal 12 is pulled to ground potential 0. The message T is followed by the lock interval dt, which may last I ms, for example.

Line b shows the respective potential state u2 of the single-wire line 95 if the number N=3 is transmitted as message T. The single-wire line 95 is pulled to the one level by the pull-up resistor 90 and reaches this level at the instant t2. In the processor 60, the one level is detected and the single-wire line 95 is pulled to the zero level by the output stage 65 at the instant t3, the zero level being reached approximately at the instant t4. From this instant t4, the one-to-zero transition is also detected in the transmitter 10, whereby the down counter ZE is decremented by one count. At the instant t5, the processor port 68 is enabled, so that the pull-up resistor 90 can pull the single-wire line 95 to the one level again, which is reached at the instant t6. Within the message T, three pulses are thus transmitted. It is again pointed out that the control and timing are effected exclusively by the processor 60. The processor identifies the end of the message by detecting the zero level instead of the one level at the instant t6', see also line h.

Line c shows a potential curve u2 of the single-wire line 95 which is similar to that of line b, the only difference being that in the lock interval dt, the single-wire line is pulled to the one state by the push-pull output 65 of the processor 60. This generates a reset pulse R at the instant tR which is detected by means of a collision detection circuit implemented with the comparator 35 in the transmitter 10, and terminates the lock interval dt. The bus collision is caused by the fact that the push-pull stage 65 pulls up the single-wire line 95 via a low impedance, whereas the switching transistor 26 pulls the single-wire line down to ground potential. Any short circuit between the positive supply voltage VDD and the ground terminal 13 is prevented by the decoupling resistor 27. By evaluating the voltage difference ur across this decoupling resistor 27, the bus collision can be detected and the lock interval dt terminated. The voltage difference is measured by means of the comparator 35. The voltage difference ur in the event of a bus collision is shown in line e of the timing diagram. The reset pulse R can reset, for example, a flip-flop in the output control stage 25, which was set at the end of the message by the timing generator 40.

Line d of the timing diagram shows the drive voltage u3 for the output stage 65. The pull-down of the processor port 68 to ground potential occurs for the first time at the instant t3 and is terminated at the instant t5. Within the message T, this occurs again two further times, since the number to be transmitted in N=3.

Line e shows the voltage difference ur across the decoupling resistor 27, which has a nonzero value only in the presence of the reset pulse R. The pull-up to the one level is cancelled at the instant t3', whereby the bus collision is also cancelled. At the instant t8 at the earliest, the transmitter 10 can notify the processor 60 of its intention to transmit a new message.

Line f shows the duration and position of the message Tp in the data-processing device 80. The message Tp is shifted in time with respect to the message T of the transmitter 10, at line a. This is due to the fact that in the processor 60, the beginning and end of the message can be detected, respectively, at the instants t2 and t6 at the earliest. This is connected with the timing of the forced control and interrogation in the processor 60.

In Line g, the message T and the lock interval tv, shortened by the reset pulse R, are illustrated in comparison with line a with the aid of the inverted drive signal $\overline{u1}$. The new message is announced to the processor at the instant t1'.

Line h shows the output u4. of the sensor circuit 70. This signal also forms the pulses which are fed as the coded number N to the data-processing device 80. The transmission time for one pulse is of the order of 30 microseconds, depending on the clock period of the processor. This time is, as a rule, much shorter than the duration of the lock interval of, e.g., 1 ms. On the other hand, the transmission is fast enough to transmit slow processes, which occur particularly with manual operations.

Referring to FIG. 3 in conjunction with FIG. 1 there is shown a flowchart, whose sequence of steps is initiated and terminated by the transmitter 10. The output control circuit 25 includes a down counter ZE, which in the start phase is preset by the encoder 20 to the number N, which is the number determined by the encoder from the applied input signals si. The imaginary time axis in FIG. 3 runs from the top to the bottom, so that blocks drawn at the same horizontal level are activated at approximately the same time. The times specified in FIG. 2 are indicated in FIG. 3 besides the respective blocks. An up counter ZP in the processor 60, which corresponds to the down counter ZE in the transmitter 10, forms part of the processing device 80 and will generally be implemented as a subprogram. The flowchart of FIG. 3 serves essentially to illustrate the interlinked sequences of operations in the transmitter and the processor.

The start 100 at the instant t1 is followed by the presetting of the down counter ZE to the value N, at block 102. The next step at block 104 is the enabling of the output terminal 12. Thus, the single-wire line 95 goes from the zero level to the one level. This level is detected in the processor 60 and in the transmitter 10 at the instant t2 at the earliest at blocks 108 and 106, respectively. In the processor, the one level initiates an acceptance routine at block 110 which sets the up counter ZP in the processor to zero, at block 112. The next step 114 is the pulling of processor output 68 to zero level, which is initiated at the instant t3. The forced one-to-zero transition is detected in the processor at block 116 and in the transmitter at block 122 at about the instant t4. As a result, the count Z of the counter in the processor is incremented by the number "1" at block 120, and the count Z of the counter in the transmitter is decremented by the number "1" at block 124. As the next step 118, the pull-down of the processor output 68 to zero level is cancelled at the instant t5, with the single-wire line 95 being pulled up to the one level by the circuit means 90 or held at zero level by the output terminal 12. The logic state of the switch stage 26, 27 in the transmitter 10 is linked with the count Of the down counter ZE and thus requires that the count be checked at block 126. If the count is greater than zero, the switch stage 26, 27 remains blocked or turned off. When the count Z has reached the value zero, however, the switch stage 26, 27 will immediately be switched to the zero level or turned on at block 128. The one level or higher-priority zero level is accepted by the single-wire line until the instant of measurement t6 or t6', respectively at block 130. In the next step 132, the processor 60 determines which voltage level the single-wire line 95 has. In the processor, the respective voltage level results in the following logic decision: At a one level, a return to the functional block 114 occurs, and at a zero level, transfer of the count Z as a transmitted number N takes place as the next step 134.

Another consequence of this level check is that in the processor, the end of the message has been detected since the instant t6' at block 136. Thus, initiation of the reset pulse R is possible at any time tR within the lock interval dt at block 138. The reset pulse and the zero state on the single-wire line at block 128 combine and form the bus collision at block 140. By means of the bus collision detection circuit 35, the voltage difference ur is monitored in the lock interval dt, see block 142. If there is no voltage difference, the whole lock interval dt expires, see block 144, before a new start process at block 146 can be initiated from the instant t1. If the voltage difference ur is nonzero, however, the lock interval dt will be terminated at the instant t8 and a new start process at block 148 can be initiated from the instant t1'.

It will be understood that the present invention data transmission system described herein is merely exemplary and that a person skilled in the art may make many variations and modifications to the described embodiment utilizing functionally equivalent components to those described. As such, variations and modifications, including differing components and functionally equivalent circuit arrangements are intended to be within the scope of the invention as described in the appended claims.

What is claimed is:

1. A data transmission system for transmitting data over a single-wire line, said data transmission system comprising:

transmitting means including an encoder for encoding an input signal representing said data as a number and storing said number in said transmitting means, said number indicative of a number of pulses contained in a message to be transmitted, said transmitting means coupled to said single-wire line and operative to impress a first voltage level on said single-wire line during a first mode and a second voltage level on said single-wire line during a second mode;

processing means including detection means coupled to said single-wire line, said processing means operative to enable pulse transmission over said single-wire line upon detection of said first voltage level on said single-wire line by said detection means;

means included in said transmitting means to cause the number of pulses indicative of the number stored by said encoder to be transmitted, and, upon completion of said transmission of said number of pulses, to cause said transmitting means to operate in said second mode and thereby to apply said second voltage level on said single-wire line; and said transmitting means further including an output terminal coupled to said single-wire line for outputting said pulses;

switching means coupled to said output terminal for switching said output terminal between said first voltage level and said second voltage level;

output control circuit coupled to said switching means for controlling switching thereof, said output control circuit further including sensing means coupled to said output terminal for sensing of said first voltage level and said second voltage level.

2. The data transmission system of claim 1, wherein said processing means includes:

an input/output (I/O) port coupled to said single-wire line;

sensing circuit coupled to said (I/O) port for sensing of said first and second voltage level;

an I/O controller coupled to said sensing circuit and said I/O port for switching said I/O port between said first and second voltage level; and a clock generator coupled to said I/O controller for providing timing to said processor.

3. The system of claim 1, wherein said output control circuitry includes timing circuitry, said timing circuitry operative to provide a lock interval at the end of a message, said output terminal being held at said second voltage level during said lock interval to thereby separate the end of said message from the beginning of a new message.

4. The system of claim 1, wherein said transmitting means further includes counting means for storing the number of pulses to be transmitted in a message as a numeric value, said stored value being altered upon a pulse being transmitted by said transmitting means, wherein a predetermined value in said counting means indicates the end of a message.

5. The system of claim 1, wherein said transmitting means further includes a collision detection circuit for detecting a collision when said single-wire line is at said first voltage level and an output terminal of said transmitting means coupled to said single-wire line is at said second voltage level, said collision detection circuit operative to provide a reset signal to said transmitting means, wherein a new message may be transmitted after detection of said reset signal.

6. The system of claim 5, wherein said collision detection circuit includes a comparator circuit, said coupling between said output terminal and said single-wire line occurs through a coupling resistance and said comparator circuit is operative to measure a predetermined voltage across said oupling resistance for determination of a reset condition.

7. The system of claim 1, wherein said transmitting means includes an active switching element for pulling said single-wire line up to a predetermined voltage level, said active switching element responsive to said output control circuitry of said transmitting means.

8. The system of claim 1, wherein said transmitting means includes a signal source for generating data to be encoded by said encoder.

9. The system of claim 7, wherein said signal source operates to provide rotational signal information to said transmitting means.

10. The system of claim 1, wherein said transmitting means is implemented as a semiconductor integrated circuit.

11. The system of claim 10, wherein said semiconductor integrated circuit comprises at least one monolithic integrated sensor as a signal source for said transmitting means.

12. A method of transmitting data from a transmitting means to a processing means over a single-wire line, comprising the steps of:
   encoding an input signal representing said data as a number and storing said number, said number being indicative of a number of pulses to be transmitted as a message corresponding to said input signal;
   causing an output of said transmitting means to be changed from one logic state to another logic state as an indication of a message being available for transmission, said output being applied to said single-wire line and said one logic state being represented by a first voltage level and said another logic state being represented by a second voltage level;
   causing an acknowledgement signal to be applied to said single-wire line by said processing means in response to said message-available logic state applied to said single-wire line from said transmitting means, said acknowledgement signal being operative to enable pulse transmission from said transmitting means;
   determining a differential between the number of pulses transmitted by said transmitting means and said stored number, wherein a predetermined value is indicative of an end of the message to be transmitted;
   providing an indication in said transmitting means when said differential is equal to said predetermined value, thereby causing said transmitting means to stop transmitting and causing the logic state of said transmitting means output, and thereby the logic state of said single-wire line, to be changed as an end-of-message indication for said processing means.

13. The method according to claim 12, including the step of applying a lock interval following said end-of-message indication, wherein further messages may not be transmitted during said lock interval, said single-wire line being held at said changed logic state occurring in response to said end-of-message indication during said lock interval.

14. The method according to claim 13, wherein timing for said lock interval is provided by said transmitting means and wherein said lock interval has a duration at least as long as the maximum time required by said processor for sensing a transition from one logic level to another logic level.

15. The method according to claim 12, further including the step of generating a reset pulse at said transmitting means by means of a collision detection circuit, said reset pulse signifying that a new message may be transmitted.

16. The method of claim 15, wherein said reset pulse is generated by measuring a voltage between said single-wire line and an output of said transmitting means coupled to said single-wire line.

17. The method of claim 12, further including the steps of:
   loading a counter coupled to said transmitting means with the numeric value of said stored number provided by said encoder;
   altering said numeric value contained in said counter upon transmission of a pulse from said transmitting means;
   causing said end-of-message indication to be provided when the value in said counter reaches a predetermined value.

18. The method of claim 12, further including the step of generating from a signal source data to be encoded by said encoder.

19. A data transmission system for transmitting data over a single-wire line, said data transmission system comprising:
   transmitting means for causing a sequence of pulses representing a message to be transmitted over said single-wire line, said transmitting means further comprising;
   encoding means for encoding an input signal as a number, said number corresponding with a number of pulses comprising said sequence of pulses representing said message;
   storage means for storing said encoded number;
   state-change means for causing an output of said transmitting means to change from one logic state to another logic state, said output being applied to said single-wire line, whereby a predetermined logic state applied to said single-wire line is recognized as an indication of a message available for transmission;
   means for determining that a predetermined criteria for completion of transmission for said message has been satisfied and to thereupon cause said state change means to cause a change in logic state for said output indicative of an end of said message;
   processing means operative to enable transmission of said pulses over said single-wire line, including means for detecting said number of pulses transmitted and for recognizing said encoded signal represented by said transmitted sequence of pulses;
   wherein said processing means operates to monitor a logic state applied to said single-wire line by said transmitting means and, upon recognition of a state change on said single-wire line indicative of an available message transmission by said transmitting means, is enabled to provide a signal to said transmitting means, via said single wire line, thereby causing said transmitting means to transmit said sequence of pulses representing said message.

20. The system of claim 19, wherein said transmitting means further includes
   output control circuit means coupled to said state-change means for controlling changes thereof, said output control circuit further including sensing means coupled to said transmitting means output for sensing of said logic states.

21. The system of claim 19, wherein said end-of-message determining means includes
   counting means for storing the number of pulses to be transmitted in a message as a numeric value, said stored value being altered upon a pulse being transmitted by said transmitting means, wherein a predetermined value in said counting means indicates the end of a message.

22. The system of claim 19, wherein said transmitting means further includes
   a collision detection circuit for detecting a collision when said single-wire line is at one logic level, represented by a first voltage level, and an output terminal of said transmitting means coupled to said single-wire line is at another logic level, represented by a second voltage level, said collision detection circuit operative to provide a reset signal to said transmitting means, wherein a new message may be transmitted after detection of said reset signal.

23. A method of transmitting data from a transmitting means to a processing means over a single-wire line, comprising the steps of:

encoding an input signal representing said data as a number and storing said number, said number being indicative of a number of pulses to be transmitted as a message corresponding to said input signal;

causing an output of said transmitting means to be changed from one logic state to another logic state as an indication of a message being available for transmission, said output being applied to said single-wire line and said one logic state being represented by a first voltage level and said another logic state being represented by a second voltage level;

causing an acknowledgement signal to be applied to said single-wire line by said processing means in response to said message-available logic state applied to said single-wire line from said transmitting means, said acknowledgement signal being operative to enable pulse transmission from said transmitting means;

determining a differential between the number of pulses transmitted by said transmitting means and said stored number, wherein a predetermined value is indicative of an end of the message to be transmitted;

providing an indication in said transmitting means when said differential is equal to said predetermined value, thereby causing said transmitting means to stop transmitting and causing the logic state of said transmitting means output, and thereby the logic state of said single-wire line, to be changed as an end-of-message indication for said processing means; and applying a lock interval following said end-of-message indication, wherein further messages may not be transmitted during said lock interval, said single-wire line being held at said changed logic state occurring in response to said end-of-message indication during said lock interval;

wherein timing for said lock interval is provided by said transmitting means and wherein said lock interval has a duration at least as long as the maximum time required by said processor for sensing a transition from one logic level to another logic level.

24. The method according to claim 23, further including the step of generating a reset pulse at said transmitting means by means of a collision detection circuit, said reset pulse signifying that a new message may be transmitted.

25. The method of claim 23, further including the steps of:

loading a counter coupled to said transmitting means with the numeric value of said stored number provided by said encoder;

altering said numeric value contained in said counter upon transmission of a pulse from said transmitting means;

causing said end-of-message indication to be provided when the value in said counter reaches a predetermined value.

* * * * *